(12) United States Patent
Eckel

(10) Patent No.: US 9,263,933 B2
(45) Date of Patent: Feb. 16, 2016

(54) METHOD FOR COMMUTATING A CURRENT IN AN ELECTRONIC POWER CONVERTER PHASE FROM A REVERSE-CONDUCTING IGBT IN A DIODE MODE TO A REVERSE-CONDUCTING IGBT IN AN IGBT MODE

(75) Inventor: Hans-Günter Eckel, Rostock (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 538 days.

(21) Appl. No.: 13/380,172

(22) PCT Filed: May 17, 2010

(86) PCT No.: PCT/EP2010/056682
§ 371 (c)(1),
(2), (4) Date: Dec. 22, 2011

(87) PCT Pub. No.: WO2010/149430
PCT Pub. Date: Dec. 29, 2010

(65) Prior Publication Data
US 2012/0092912 A1    Apr. 19, 2012

(30) Foreign Application Priority Data

Jun. 26, 2009   (DE) .................. 10 2009 030 740

(51) Int. Cl.
*H02M 1/08*   (2006.01)
*H02M 1/16*   (2006.01)
(Continued)

(52) U.S. Cl.
CPC . *H02M 1/08* (2013.01); *H02M 1/16* (2013.01); *H02M 7/5387* (2013.01);
(Continued)

(58) Field of Classification Search
CPC . H02M 2001/0009; H02M 1/16; H02M 7/42; H02M 7/48; H02M 7/5387; H02M 1/08
USPC ............... 363/95, 97, 98, 125, 126, 127, 131, 363/132, 18, 21.04, 21.07, 21.08, 21.09, 363/21.12, 21.15, 21.16, 21.17
See application file for complete search history.

(56) References Cited

U.S. PATENT DOCUMENTS 5,321,348 A * 6/1994 Vinciarelli ............ H02M 3/156
                                                        323/222
5,751,560 A * 5/1998 Yokoyama ............ H02M 3/335
                                                        363/131

(Continued)

FOREIGN PATENT DOCUMENTS

CN        1588799 A       3/2005
DE       10200332 A1      7/2002
(Continued)

OTHER PUBLICATIONS

A High Current 3300V Module Employing Reverse Conducting IGBTs Setting a New Benchmark in Output Power Capability; Proc. ISPSD'2008; M. Rahimo, U. Schlapbach, A. Kopta, J. Vobecky, D. Schneider, A. Baschnagel; Others; 2008, 2009Q08886.
(Continued)

*Primary Examiner* — Jue Zhang
*Assistant Examiner* — Lakaisha Jackson
(74) *Attorney, Agent, or Firm* — Henry M. Feiereisen LLC.

(57) ABSTRACT

The invention relates to a method for commutating from a reverse-conducting IGBT (T1) operated in the diode mode to a reverse-conducting IGBT (T2) operated in the IGBT mode. According to the invention the reverse-conducting IGBT (T1) operated in the diode mode is turned off only at the instant a current starts to flow in the reverse-conducting IGBT (T2) operated in the IGBT mode. Accordingly said commutation method is event-driven, as a result of which it is less sensitive to poorly toleranced operating times.

5 Claims, 4 Drawing Sheets

(51) Int. Cl.
  *H02M 7/5387* (2007.01)
  *H02M 1/00* (2007.01)
  *H03K 17/66* (2006.01)

(52) U.S. Cl.
  CPC .... *H02M 2001/0009* (2013.01); *H03K 17/665* (2013.01); *H03K 2217/0027* (2013.01); *H03K 2217/0036* (2013.01)

(56) References Cited

U.S. PATENT DOCUMENTS

| | | | | |
|---|---|---|---|---|
| 5,815,391 | A * | 9/1998 | Pelly | H02P 6/002 363/132 |
| 6,118,675 | A * | 9/2000 | Lionetto | H02M 1/36 363/21.13 |
| 6,566,855 | B1 | 5/2003 | Nguyen et al. | |
| 6,678,180 | B2 * | 1/2004 | Matsuda | H02M 1/38 318/810 |
| 7,417,409 | B2 * | 8/2008 | Partridge | H02M 3/156 323/222 |
| 8,072,241 | B2 * | 12/2011 | Kouno | H01L 29/7397 326/118 |
| 2003/0001630 | A1 * | 1/2003 | Sakata | H02M 1/08 327/108 |
| 2004/0196678 | A1 | 10/2004 | Miyamoto | |
| 2005/0242748 | A1 * | 11/2005 | Nagahara | H05K 7/20963 315/169.4 |
| 2009/0033255 | A1 | 2/2009 | John et al. | |
| 2010/0079192 | A1 * | 4/2010 | Strzalkowski | H02M 7/53803 327/419 |
| 2013/0082741 | A1 * | 4/2013 | Domes | H03K 17/13 327/79 |

FOREIGN PATENT DOCUMENTS

| | | |
|---|---|---|
| EP | 2073271 A1 | 6/2009 |
| RU | 63919 U1 | 10/2007 |
| WO | WO 0221691 A1 | 3/2002 |
| WO | WO 0241085 A2 | 5/2002 |

OTHER PUBLICATIONS

Mark M. Bakran, Martin Helspor, Hans-Günter Eckel: Multiple turn on of IGBTs in Large Inverters Seiten 1609-1614, 2006; Magazine; 2006, 2010Q05409.

* cited by examiner

METHOD FOR COMMUTATING A CURRENT IN AN ELECTRONIC POWER CONVERTER PHASE FROM A REVERSE-CONDUCTING IGBT IN A DIODE MODE TO A REVERSE-CONDUCTING IGBT IN AN IGBT MODE

CROSS-REFERENCES TO RELATED APPLICATIONS

This application is the U.S. National Stage of International Application No. PCT/EP2010/056682, filed May 17, 2010 , which designated the United States and has been published as International Publication No. WO 2010/149430 and which claims the priority of German Patent Application, Ser. No. 10 2009 030 740.0, filed Jun. 26, 2009, pursuant to 35 U.S.C. 119(a)-(d).

BACKGROUND OF THE INVENTION.

The invention relates to a method for commutating from a reverse-conducting IGBT operated in the diode mode to a reverse-conducting IGBT operated in the IGBT mode which form a power converter phase and are electrically connected in parallel with a direct-current voltage source. The invention further relates to an apparatus for performing the inventive method.

IGBTs that are able to conduct current in the opposite direction are also known as Reverse-Conducting IGBTs (RC-IGBTs). Said RC-IGBTs are a further development of the known reverse-blocking IGBTs. An RC-IGBT differs from a conventional IGBT in that the diode function and the IGBT function are combined in one chip. This results in a power semiconductor in which anode efficiency in the diode mode is dependent on the gate voltage. This demands a change in the way such devices are driven compared with conventional IGBTs.

In reverse-conducting IGBTs anode efficiency in the diode mode can be controlled by means of the gate. If the gate is turned on, anode efficiency is reduced, whereas the forward voltage increases and the stored charge decreases. If on the other hand the gate is turned off, anode efficiency remains high, as a result of which the forward voltage is low and the stored charge high.

This behavior of the reverse-conducting IGBT can be used in order to reduce the reverse-recovery losses of the reverse-conducting IGBT operated in the diode mode and the turn-on losses of the second reverse-conducting IGBT of a power converter phase.

A method for commutating from a reverse-conducting IGBT operated in the diode mode to a reverse-conducting IGBT operated in the IGBT mode is described in the publication "A High Current 3300V Module Employing Reverse Conducting IGBTs Setting a New Benchmark in Output Power Capability" by M. Rahimo, U. Schlapbach, A. Kopta, J. Vobecky, D. Schneider and A. Baschnagel, printed in ISPSD 2008. According to said known method, an IGBT operated in the diode mode is turned on after a predetermined first delay time, starting from the time instant of a setpoint turn-off control signal, has elapsed. Of the two RC-IGBTs connected in series, the IGBT operated in the IGBT mode is turned on after a predetermined second delay time, starting from the time instant of a setpoint turn-on control signal, has elapsed. Immediately before the RC-IGBT operated in the IGBT mode is turned on, the RC-IGBT operated in the diode mode is turned off again. For that purpose a time period is predefined for the RC-IGBT operated in the diode mode, for the duration of which said reverse-conducting IGBT remains turned on.

A shortcoming of said known method is the sensitivity toward poorly toleranced operating times. On the one hand the gate voltage of the reverse-conducting IGBT operated in the diode mode must be reduced below a so-called threshold voltage before a reverse current peak of the reverse-conducting IGBT operated in the diode mode is reached. On the other hand the reverse-conducting IGBT operated in the diode mode must not yet have been turned off for a long time when the reverse-conducting IGBT operated in the IGBT mode is turned on, because otherwise the effect of the decrease in anode efficiency is no longer active. However, the signal paths from a higher-ranking control device, for example a control device of a power converter, to the control circuits (also referred to as driver circuits) of the two RC-IGBTs electrically connected in series have a potential separation in each case. This leads to relatively wide tolerances in the switching times, thereby further widening the tolerances in the drive paths of the RC-IGBTs electrically connected in series. As a result the activation of the mutually coordinated delay times necessitates a great investment of time and resources.

The object underlying the invention is therefore to develop the known method in such a way that it is less sensitive to poorly toleranced operating times.

SUMMARY OF THE INVENTION

According to the invention, this object is achieved by a method for commutating from a first reverse-conducting IGBT operated in a diode mode to a second reverse-conducting IGBT operated in an IGBT mode, wherein the first reverse-conducting IGBT and the second reverse-conducting IGBT are electrically connected in series and form a power converter phase, with the series connection being electrically connected in parallel with a direct-current voltage source. The method includes the steps of detecting that a control signal of the first reverse-conducting IGBT has switched to an off-state and turning on the first reverse-conducting IGBT after a first predetermined time period has elapsed, detecting that a control signal of the second reverse-conducting IGBT has switched to an on-state and turning on the second reverse-conducting IGBT after a second predetermined time period has elapsed, wherein the second time period is substantially greater than the first time period, and turning off the first reverse-conducting IGBT before the second reverse-conducting IGBT turns on, wherein the first reverse-conducting IGBT is turned off only when a current starts to flow in the second reverse-conducting IGBT.

Accordingly the gate of the reverse-conducting IGBT operated in the diode mode is no longer turned off as a time-controlled operation, but rather this action is event-driven. According to the inventive method the commencement of a flow of electric current through a reverse-conducting IGBT operated in the IGBT mode is chosen as the event.

In a first embodiment variant this time instant of the current flow through the reverse-conducting IGBT operated in the IGBT mode is determined by means of a voltage dropping at an inductor, said inductor being arranged in the commutation circuit. The rate of rise of on-state current in the commutation circuit is greater by at least a power of ten than in an associated load circuit. By this means the start of the commutation can be unambiguously determined without great effort on the basis of the inductive voltage drop. The commutation accordingly leads to a high positive current change ($di_C/dt$) and consequently to a high, in absolute terms, negative voltage value at the inductor which is used as a measurement voltage. The characteristic curve of said measurement voltage is evaluated in respect of a predetermined limit value, a downstream driver circuit being activated as soon as said limit value is reached or exceeded.

An advantageous embodiment variant of the device for detecting the time instant of the current flow in the reverse-conducting IGBT operated in the IGBT mode is a leakage inductor which is arranged between auxiliary emitter and power emitter inside the RC-IGBT module. Said leakage inductor is electrically connected in parallel with the two inputs of an evaluation device.

A further possibility for detecting the time instant of the current flow in the RC-IGBT operated in the IGBT mode consists in measuring the collector current of the RC-IGBT operated in the diode mode. A particularly favorable implementation of a current measurement is the use of a current transformer constructed according to the Rogowsky coil principle. The output signal of a current transformer designed according to the Rogowsky coil principle is proportional to the current change ($di_C/dt$) and therefore is easy to evaluate as in the case of the use of an inductor in the commutation circuit.

In a further possibility for identifying the time instant of the current flow in the RC-IGBT operated in the IGBT mode the current is detected by means of a saturable transformer. A zero crossing of the collector current through the IGBT operated in the diode mode is determined by means of such a transformer. A saturable transformer supplies an output signal only when the magnetic field strength is located in the narrow linear range of the magnetization characteristic. As a result the gate of the reverse-conducting IGBT operated in the diode mode discharges not at the start of the commutation process, but only at the zero crossing of the collector current, which is to say at the start of the reverse-recovery current.

BRIEF DESCRIPTION OF THE DRAWING

In order to explain the invention further reference is made to the drawing, in which several embodiment variants of an apparatus for performing the method according to the invention are illustrated schematically.

FIG. 9 shows a block circuit diagram of a third embodiment variant of the apparatus for performing the commutation method according to the invention, whereas

DETAILED DESCRIPTION OF PREFERRED EMBODIMENTS

Figure 1:
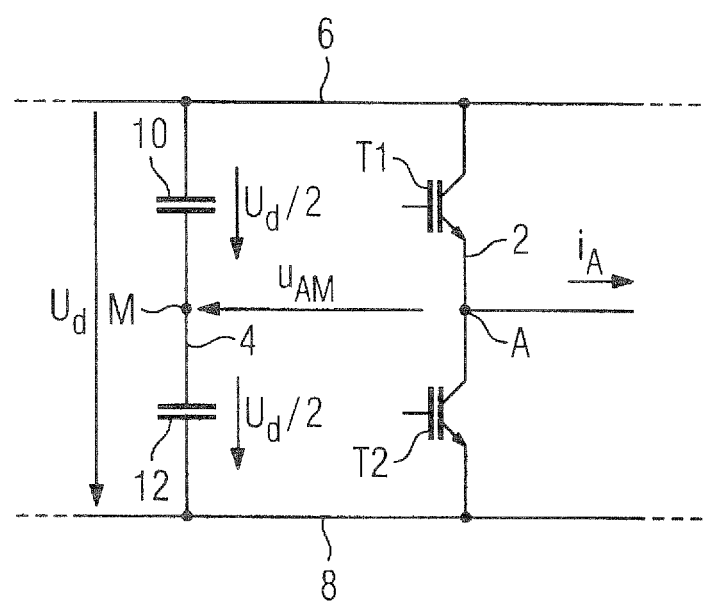
FIG. 1 shows a block circuit diagram of a bridge branch of two RC-IGBTs having a direct-current voltage source.

In FIG. 1, reference sign 2 designates a bridge branch, 4 a direct-current voltage source, 6 a positive current conductor bar, and 8 a negative current conductor bar. The bridge branch 2 and the direct-current voltage source 4 are electrically connected in parallel by means of said two current conductor bars 6 and 8. The bridge branch has two reverse-conducting IGBTs T1 and T2 which are electrically connected in series. A connection point of said two RC-IGBTs T1 and T2 is formed by an output A on the alternating-current voltage side, to which output a load can be connected. The direct-current voltage source 4 has two capacitors 10 and 12 which are likewise electrically connected in series. A connection point of said two capacitors 10 and 12 is formed by a midpoint terminal M. Alternatively, instead of the two capacitors 10 and 12, it is also possible to use just one capacitor which is arranged between the current conductor bars 6 and 8. The midpoint M is not accessible in that case. A pulse-width-modulated square-wave voltage $U_{AM}$ is present at the output A of the bridge branch 2, referred to the midpoint terminal M of the direct-current voltage source 4. A block circuit diagram shown in FIG. 1 corresponds to a part of a block circuit diagram of a multiphase current transformer, in particular an alternating current inverter.

Since the diode function and the IGBT function are combined in one chip, no freewheeling diode or inverse diode is required in the reverse-conducting IGBTs T1 and T2. On account of their reverse-conducting capability said IGBTs are also referred to as RC-IGBTs (Reverse-Conducting Insulated Gate Bipolar Transistors). Because the diode and IGBT functionality are integrated in a single chip, said RC-IGBT can be operated both in the diode mode (negative collector-emitter current) and in the IGBT mode (positive collector-emitter current). In the diode mode the anode efficiency can be controlled by means of the gate. If the gate is turned on, anode efficiency is reduced and consequently the forward voltage increases, whereas the stored charge decreases. If the gate is turned off, anode efficiency remains high. The result of this is that the conduction losses are low and the stored charge is high.

Figure 2:
FIGS. 2 and 3 show the time characteristics of setpoint control signals of the two RC-IGBTs of the bridge branch according to FIG. 1 in each case in a diagram over time t.
Figure 3:
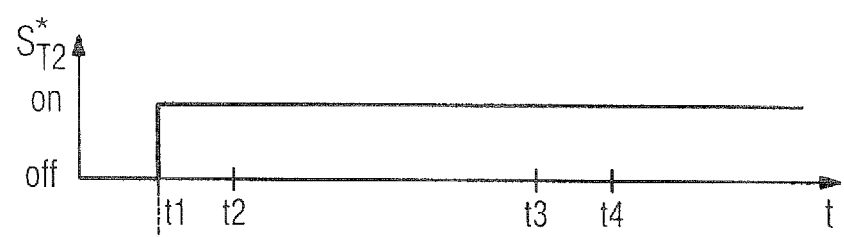
Figure 4:
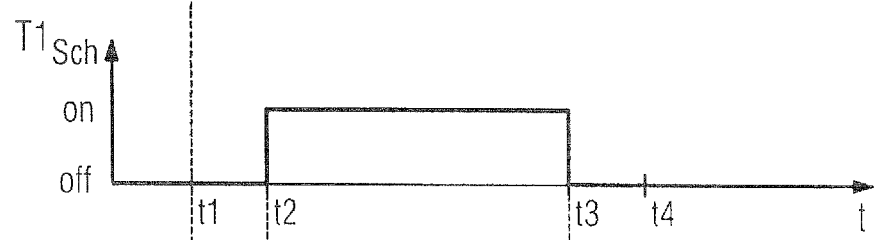
FIGS. 4 and 5 show the time characteristics of actual control signals of the two RC-IGBTs of the bridge branch according to FIG. 1 in each case in one of the two diagrams over time t.
Figure 5:
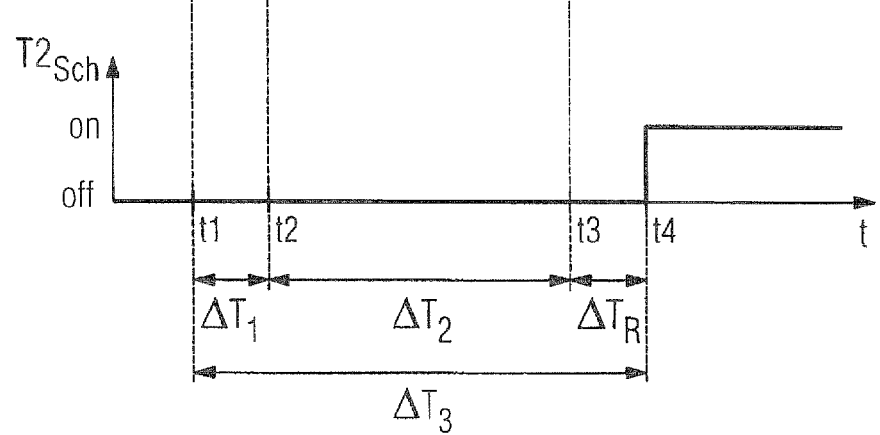

In the case of the signal characteristics of FIGS. 2 to 5 it is assumed that the reverse-conducting IGBT T1 is operated in the diode mode and the reverse-conducting IGBT T2 in the IGBT mode. In the diagram of FIG. 2 a setpoint control signal $S_{T1}^*$ for the RC-IGBT T1 operated in the diode mode is plotted over time t, whereas the diagram of FIG. 3 shows a setpoint control signal $S_{T2}^*$ for the RC-IGBT T2 operated in the IGBT mode plotted over time t. Said two setpoint control signals $S_{T1}^*$ and $S_{T2}^*$ characterize a commutation process at time instant t1. Starting from said time instant t1, the reverse-conducting IGBT T1 operated in diode mode is turned on after a time period $\Delta T1$ has elapsed (FIG. 4). The reverse-conducting IGBT T2 operated in the IGBT mode is turned on according to the time characteristic of the switching state $T2_{Sch}$ according to FIG. 5 after a time period $\Delta T3$ starting from time instant t1 has elapsed (time instant t4). At time instant t4 the reverse-conducting IGBT T2 operated in the diode mode must be turned off according to the time characteristic of the switching state $T1_{Sch}$ according to FIG. 4. On the other hand the reverse-conducting IGBT T1 operated in the diode mode must not yet have been turned off for a long time, because otherwise the effect of the decrease in anode efficiency is no longer active. That is to say that the time period $\Delta T_R$ between the RC-IGBT T1 operated in the diode mode being turned off and the RC-IGBTs T2 operated in the IGBT mode being turned on should be as small as possible. The time period $\Delta T_2$, during which the IGBT T1 operated in the diode mode is turned on, is yielded as a function of the time period $\Delta T_1$ and the time period $\Delta T_R$ referred to the time period $\Delta T_3$.

According to the publication cited in the introduction, said commutation of two reverse-conducting IGBTs T1 and T2 of an electronic power converter phase is time-driven. Said time-driven commutation requires a high degree of timing precision. In order to be on the safe side with said time-driven commutation, the time period $\Delta T_R$ is chosen to be sufficiently large so that, of two RC-IGBTs T1 and T2 electrically connected in series, the reverse-conducting IGBT T1 operated in the diode mode is reliably turned off at the turn-on time instant t4 of the reverse-conducting IGBT 12 operated in the IGBT mode. Because components that are subject to relatively large tolerances are present in the signal path from a control device to a drive circuit of the RC-IGBT T1 or T2, an even greater time period $\Delta T_R$ must be chosen.

According to the inventive method, said commutation illustrated in the diagrams of FIGS. 2 to 5 is no longer time-driven, but event-driven. The start of the current flow through the RC-IGBT T2 operated in the IGBT mode is chosen as the event. However, said event is determined at the RC-IGBT T1 operated in the diode mode.

Figure 6:
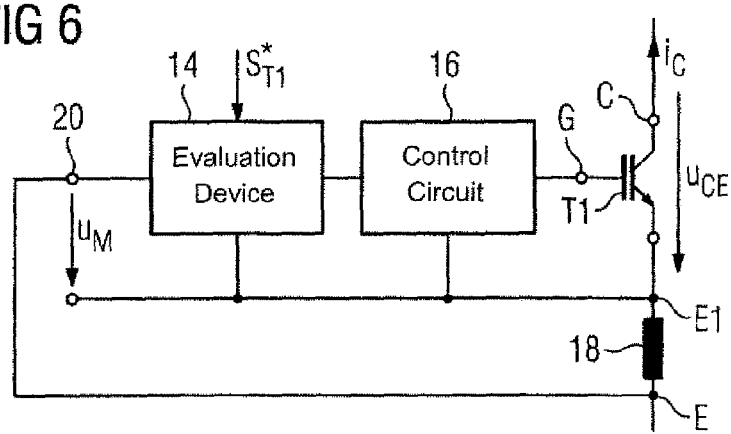
FIG. 6 shows a block circuit diagram of a first embodiment variant of the apparatus for performing the commutation method according to the invention.

A first embodiment variant of an apparatus for performing the commutation method according to the invention is depicted schematically in FIG. 6. Said apparatus has an evaluation device 14 which is linked on the output side to an input of a control circuit 16, which is also referred to as a driver switch. Said apparatus also has a device for acquiring a derivative with respect to time of the collector current $i_C$ through the RC-IGBT T1 operated in the diode mode. In other words, the current change of the collector current $i_C$ is determined. In the embodiment variant according to FIG. 6, an inductor 18, in particular a module-internal leakage inductor, is provided as the device. If the device is a module-internal leakage inductor 18, then said inductor 18 is located in the IGBT module between an auxiliary emitter E1 and an emitter terminal E. if the device is an inductor 18, the latter is linked on one side to the emitter terminal E. In the embodiment variant shown in FIG. 6, the emitter E1 forms a reference potential for the evaluation device 14 and for the driver circuit 16. Of two RC-IGBTs T1 and T2 electrically connected in series, the emitter terminal E of the RC-IGBT T1 operated in the diode mode is connected in an electrically conducting manner to an input 20 of the evaluation device 14. The evaluation device 14 is likewise supplied with the setpoint control signal $S_{T1}^*$.

Since the rate of rise of on-state current in the commutation circuit is greater by at least a power of ten than that in the load current circuit, the start of the current flow through the RC-IGBT T2 operated in the IGBT mode can be clearly detected by the voltage drop at the inductor 18 of the RC-IGBT T1 operated in the diode mode. The commutation of the collector current $i_C$ of the RC-IGBT T1 operated in the diode mode to the RC-IGBT T2 operated in the IGBT mode leads to a high positive current change $di_C/dt$ and consequently to a high, in absolute terms, negative value of a measurement voltage $u_M$. This value of the measurement voltage $u_M$ is compared in the evaluation device 14 with a predetermined threshold value. If said threshold value is reached or exceeded, the RC-IGBT T1 operated in the diode mode is turned off, i.e. the gate G of the RC-IGBT T1 operated in the diode mode therefore starts to discharge with the commencement of the commutation process.

Figure 7:
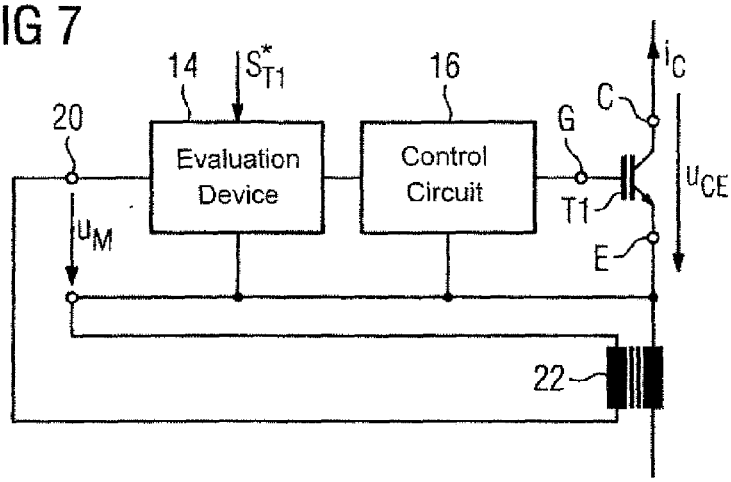
FIG. 7 shows a block circuit diagram of a second embodiment variant of the apparatus for performing the commutation method according to the invention.
Figure 8:
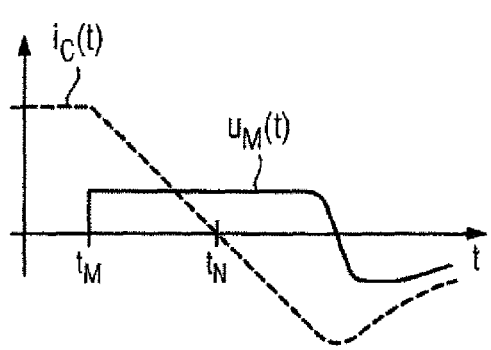
FIG. 8 shows a collector current and an associated measurement voltage in a diagram over time t.

A second embodiment variant of the apparatus for performing the commutation method according to the invention for two reverse-conducting IGBTs T1 and T2 electrically connected in series is shown in more detail in FIG. 7. Said second embodiment variant differs from the first embodiment variant in that a current transformer 22 that is constructed according to the Rogowsky coil principle is used instead of an inductor 18. The output voltage of such a current transformer 22 is proportional to the current change di/dt of the collector current $i_C$ which flows through the reverse-conducting IGBT T1 operated in the diode mode. In the diagram according to FIG. 8, the time characteristic of the collector current $i_C$ flowing through the reverse-conducting IGBT T1 operated in the diode mode and a time characteristic of a determined measurement voltage $u_M$ are plotted over time t. The current curve $i_C(t)$ corresponds to a turn-off characteristic of a diode. At the time instant $t_M$ at which the amplitude of the collector current $i_C$ starts to decrease, the characteristic curve of the measurement voltage $u_M(t)$ has a positive edge. The time instant $t_M$ of said edge is evaluated as the time instant of the start of the current flow through the reverse-conducting IGBT T2 operated in the IGBT mode. The time instant $t_M$ is the earliest possible time instant at which the reverse-conducting IGBT T1 operated in the diode mode can be turned off.

Figure 9:
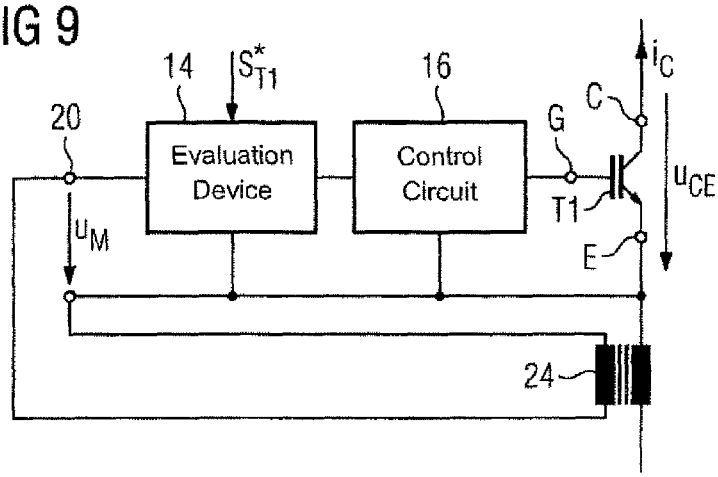
Figure 10:
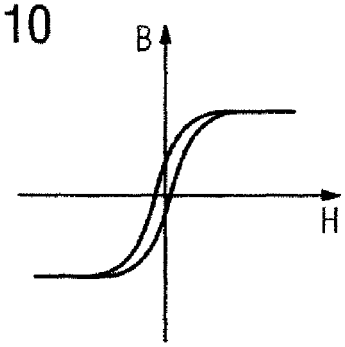
FIG. 10 shows a magnetization characteristic of a saturable transformer.
Figure 11:
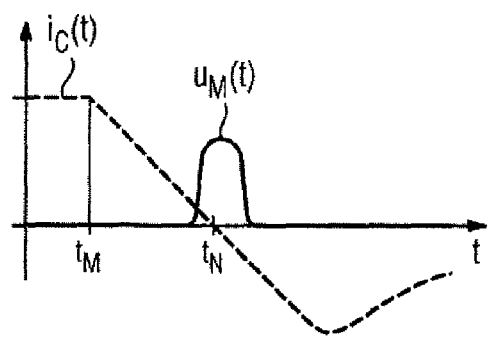
FIG. 11 shows a collector current with associated measurement voltage in a diagram over time t.

A third embodiment variant for performing the commutation method according to the invention of two reverse-conducting IGBTs T1 and T2 is shown in more detail in FIG. 9. Said third embodiment variant differs from the first embodiment variant according to FIG. 6 in that a saturable transformer 24 is provided instead of the inductor 18. A magnetization characteristic of said saturable transformer 24 is shown in FIG. 10. Said magnetization characteristic has only a narrow linear range. Only the zero crossing of the collector current $i_C$ of the reverse-conducting IGBT T1 operated in the diode mode is determined by means of said saturable transformer 24. A current zero crossing is detected by means of the saturable transformer 24 only when the magnetic field strength is located in the narrow range of the magnetization characteristic. At precisely that time said saturable transformer 24 supplies an output signal, namely a measurement voltage $u_M$. The characteristic curve of said measurement voltage $u_M$ is shown together with the time characteristic of the collector current $i_C$ of the RC-IGBT T1 operated in the diode mode in the diagram of FIG. 11 plotted over time t. Thus, the commutation time instant during the commutation from the RC-IGBT T1 operated in the diode mode to the RC-IGBT T2 operated in the IGBT mode is determined with the aid of the saturable transformer 24. Said time instant $t_N$ occurs later in time in relation to the time instant $t_M$. As a result the RC-IGBT T1 operated in the diode mode is turned off at a later time instant. This means that anode efficiency can be reduced over a longer period, as a result of which the stored charge decreases.

By means of said method according to the invention the time instant for turning off the RC-IGBT T1 operated in the diode mode, which is one of two RC-IGBTs T1 and T2 electrically connected in series, can be placed very close to the time instant t4 at which the reverse-conducting IGBT T2 operated in the IGBT mode, which is the other of said series-connected RC-IGBTs T1 and T2, is turned on, as a result of which the reduction in anode efficiency is effective for a long time. Because said method according to the invention is event-driven, it does not demand a high degree of timing precision as in the case of the known time-driven commutation method.

The invention claimed is:

1. A method for commutating from a first reverse-conducting IGBT operated in a diode mode to a second reverse-conducting IGBT operated in an IGBT mode, said first reverse-conducting IGBT and said second reverse-conducting IGBT electrically connected in series and forming a power converter phase, with the series connection being electrically connected in parallel with a direct-current voltage source, the method comprising the steps of:
   a) detecting that a control signal of the first reverse-conducting IGBT has switched to an off-state and turning on the first reverse-conducting IGBT after a first predetermined time period has elapsed,
   b) detecting that a control signal of the second reverse-conducting IGBT has switched to an on-state and turning on the second reverse-conducting IGBT after a second predetermined time period has elapsed, wherein the second time period is substantially greater than the first time period, and
   c) turning off the first reverse-conducting IGBT when a measurement voltage induced in a saturable transformer by a zero crossing of a collector current in the first reverse-conducting IGBT that is caused by an onset of a current flow through the second reverse-conducting IGBT exceeds a predetermined threshold value.

2. The method of claim 1, wherein the induced measurement voltage is determined from a voltage drop across an inductor connected in series with an emitter of the first reverse-conducting IGBT.

3. The method of claim 1, wherein the measured collector current flowing through the first reverse-conducting IGBT is evaluated for a zero crossing of the measured collector current.

4. An apparatus for commutating from a diode mode to an IGBT mode in a power converter phase of a power converter, comprising:
   a first reverse-conducting IGBT operating in a diode mode and a second reverse-conducting IGBT operating in an IGBT mode electrically connected in series, said series connection of the first reverse-conducting IGBT and said second reverse-conducting IGBT electrically connected in parallel with a direct-current voltage source,
   a driver circuit having a first output electrically connected a gate and a second output connected to an emitter terminal of the first reverse-conducting IGBT,
   a detection device embodied as a saturable transformer for detecting a collector current flowing through the first reverse-conducting IGBT, and
   an evaluation device having an output electrically connected to an input of the driver circuit and a first input electrically connected to the detection device and a second input receiving a control signal from the first reverse-conducting IGBT,
   wherein for commutation, the first reverse-conducting IGBT is turned off when a measurement voltage induced in the saturable transformer by a zero crossing of the collector current measured by the detection device that is caused by an onset of a current flow through the second reverse-conducting IGBT exceeds a predetermined threshold value.

5. An apparatus for commutating from a diode mode to an IGBT mode in a power converter phase of a power converter, comprising:
   a first reverse-conducting IGBT operating in a diode mode and a second reverse-conducting IGBT operating in an IGBT mode electrically connected in series, said series connection of the first reverse-conducting IGBT and said second reverse-conducting IGBT electrically connected in parallel with a direct-current voltage source,
   a driver circuit having a first output electrically connected a gate and a second output connected to an emitter terminal of the first reverse-conducting IGBT,
   a detection device embodied as a current transformer constructed according to the Rogowsky coil principle for detecting a collector current flowing through the first reverse-conducting IGBT, and
   an evaluation device having an output electrically connected to an input of the driver circuit and a first input electrically connected to the detection device and a second input receiving a control signal from the first reverse-conducting 1GBT,
   wherein for commutation, the first reverse-conducting IGBT is turned off when a measurement voltage induced in the current transformer by a zero crossing of the collector current measured by the detection device that is caused by an onset of a current flow through the second reverse-conducting IGBT exceeds a predetermined threshold value.

* * * * *